United States Patent
Tam et al.

(10) Patent No.: US 11,381,208 B1
(45) Date of Patent: Jul. 5, 2022

(54) CONTINUOUS TIME LINEAR EQUALIZATION SYSTEM AND METHOD

(71) Applicant: Cadence Design Systems, Inc., San Jose, CA (US)

(72) Inventors: Clarence Kar Lun Tam, Saint-Laurent (CA); Guillaume Fortin, Montreal (CA)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 17/066,184

(22) Filed: Oct. 8, 2020

(51) Int. Cl.
*H03F 3/45* (2006.01)
*H03F 1/02* (2006.01)
*H03G 3/30* (2006.01)
*H04L 27/01* (2006.01)

(52) U.S. Cl.
CPC ... *H03F 3/45197* (2013.01); *H03F 2200/372* (2013.01); *H04L 27/01* (2013.01)

(58) Field of Classification Search
CPC . H03F 3/45197; H03F 2200/372; H04L 27/01
USPC .......................................... 330/252–261, 283
See application file for complete search history.

(56) References Cited

U.S. PATENT DOCUMENTS

| | | | | |
|---|---|---|---|---|
| 9,680,418 | B2* | 6/2017 | Yuan | H03G 1/0023 |
| 9,755,599 | B2* | 9/2017 | Yuan | H03F 3/193 |
| 10,116,470 | B2* | 10/2018 | Gu | H03F 3/193 |
| 10,263,815 | B1* | 4/2019 | Geary | H03F 3/45197 |
| 10,992,271 | B2* | 4/2021 | Singh | H03F 3/45094 |

* cited by examiner

*Primary Examiner* — Hieu P Nguyen
(74) *Attorney, Agent, or Firm* — Mark H. Whittenberger, Esq.; Holland & Knight LLP

(57) ABSTRACT

The present disclosure relates to an apparatus and method for continuous time linear equalization. Embodiments include a differential amplifier including a first transistor and a second transistor, wherein the differential amplifier includes a peak-generating path and a peak-reduction path. Embodiments also include at least one switch and at least one capacitor located between a source and a drain of at least one of the first transistor and the second transistor to create a capacitive path between the source and drain, wherein the at least one switch and at least one capacitor are configured to reduce bandwidth.

16 Claims, 19 Drawing Sheets

300

500

1900 providing a differential amplifier including a first transistor and a second transistor, wherein the differential amplifier includes a peak-generating path and a peak-reduction path

1902

reducing bandwidth using a first switch and a first capacitor located between a source and a drain of the first transistor and a second switch and a second capacitor located between a source and a drain of the second transistor to create a capacitive path between the source and drain

CONTINUOUS TIME LINEAR EQUALIZATION SYSTEM AND METHOD

FIELD OF THE INVENTION

The present disclosure relates to serializer/deserializer systems, and more specifically, to a method for continuous time linear equalization ("CTLE").

DISCUSSION OF THE RELATED ART

Serializer/deserializer ("SerDes") components are becoming common on integrated System-on-a-chip ("SOC") and Application Specific Integrated Circuits ("ASICs"). The higher demand of high-speed wide-band data rates may require high-speed serial data links (or TX/RX links) that are widely used for sending data over various media, such as cables, board traces and/or backplanes. These media are often referred to as channels.

The continuous time linear equalization ("CTLE") for a SerDes receiver needs to provide a wide tuning range of high frequency gain (peaking) for equalizing a variety of channel lengths, for example, high peaking to equalize high-loss (long) channels, low peaking for low-loss (short) channels, etc. Classic CTLE circuit designs in advanced CMOS nodes are plagued by parasitic capacitances which produce unwanted over-equalization for low-loss channels. Conventional circuit fixes for these unwanted over-equalization often result in a significant increase in silicon area.

SUMMARY OF INVENTION

In one embodiment of the present disclosure, an apparatus for continuous time linear equalization is provided. The apparatus may include a differential amplifier including a first transistor and a second transistor, wherein the differential amplifier includes a peak-generating path and a peak-reduction path. The apparatus also include at least one switch and at least one capacitor located between a source and a drain of at least one of the first transistor and the second transistor to create a capacitive path between the source and drain, wherein the at least one switch and at least one capacitor are configured to reduce bandwidth.

One or more of the following features may be included. The at least one switch and the at least one capacitor may include a first switch and a first capacitor located between a source and a drain of the first transistor and a second switch and a second capacitor located between a source and a drain of the second transistor. The at least one switch may be disconnected in a peak generation mode and connected in a peak reduction mode. The apparatus may include a source degenerated capacitor array that is connected in a peak generation mode and disconnected in a peak reduction mode. The source degenerated capacitor array may include one capacitor or a plurality of capacitors. The first switch and the second switch may be connected in a source degenerative configuration wherein the source degenerative configuration is connected in a peak generation mode and disconnected in a peak reduction mode, wherein the source degenerated capacitor array includes a plurality of capacitors.

In another embodiment of the present disclosure, a method for continuous time linear equalization is provided. The method may include providing a differential amplifier including a first transistor and a second transistor, wherein the differential amplifier includes a peak-generating path and a peak-reduction path. The method may further include reducing bandwidth using a first switch and a first capacitor located between a source and a drain of the first transistor and a second switch and a second capacitor located between a source and a drain of the second transistor to create a capacitive path between the source and drain.

One or more of the following features may be included. At least one of the first switch and the second switch may be disconnected in a peak generation mode and connected in a peak reduction mode. The method may include connecting a source degenerated capacitor array in a peak generation mode or disconnecting the source degenerated capacitor array in a peak reduction mode. The source degenerated capacitor array may include one capacitor or a plurality of capacitors. The first switch and the second switch may be connected in a source degenerative configuration, wherein the source degenerative configuration is connected in a peak generation mode and disconnected in a peak reduction mode, wherein the source degenerated capacitor array includes a plurality of capacitors.

In another embodiment of the present disclosure, a method for continuous time linear equalization is provided. The method may include providing a differential amplifier including a first transistor and a second transistor, wherein the differential amplifier includes a peak-generating path and a peak-reduction path. The method may further include reducing high frequency peaking using at least one switch and at least one capacitor located between a source and a drain of the first transistor. The method may also include enabling N of the at least one capacitor and each of the at least one switch in a peak reduction position during maximum peak reduction, wherein N is a maximum number of capacitors.

One or more of the following features may be included. The method may include enabling N−1 of the at least one capacitor and the at least one switch in a peak reduction position. The method may also include enabling one of the at least one capacitor and each of the at least one switch in a peak reduction position. The method may further include enabling zero of the at least one capacitor and none of the at least one switch. The method may also include enabling one of the at least one capacitor and each of the at least one switch in a peak generation position. The method may further include enabling N−1 of the at least one capacitor and each of the at least one switch in a peak generation position. The method may also include enabling N of the at least one capacitor and each of the at least one switch in a peak generation position during maximum peak generation.

Additional features and advantages of embodiments of the present disclosure may be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

FIG. 19 is flowchart depicting operations consistent with embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
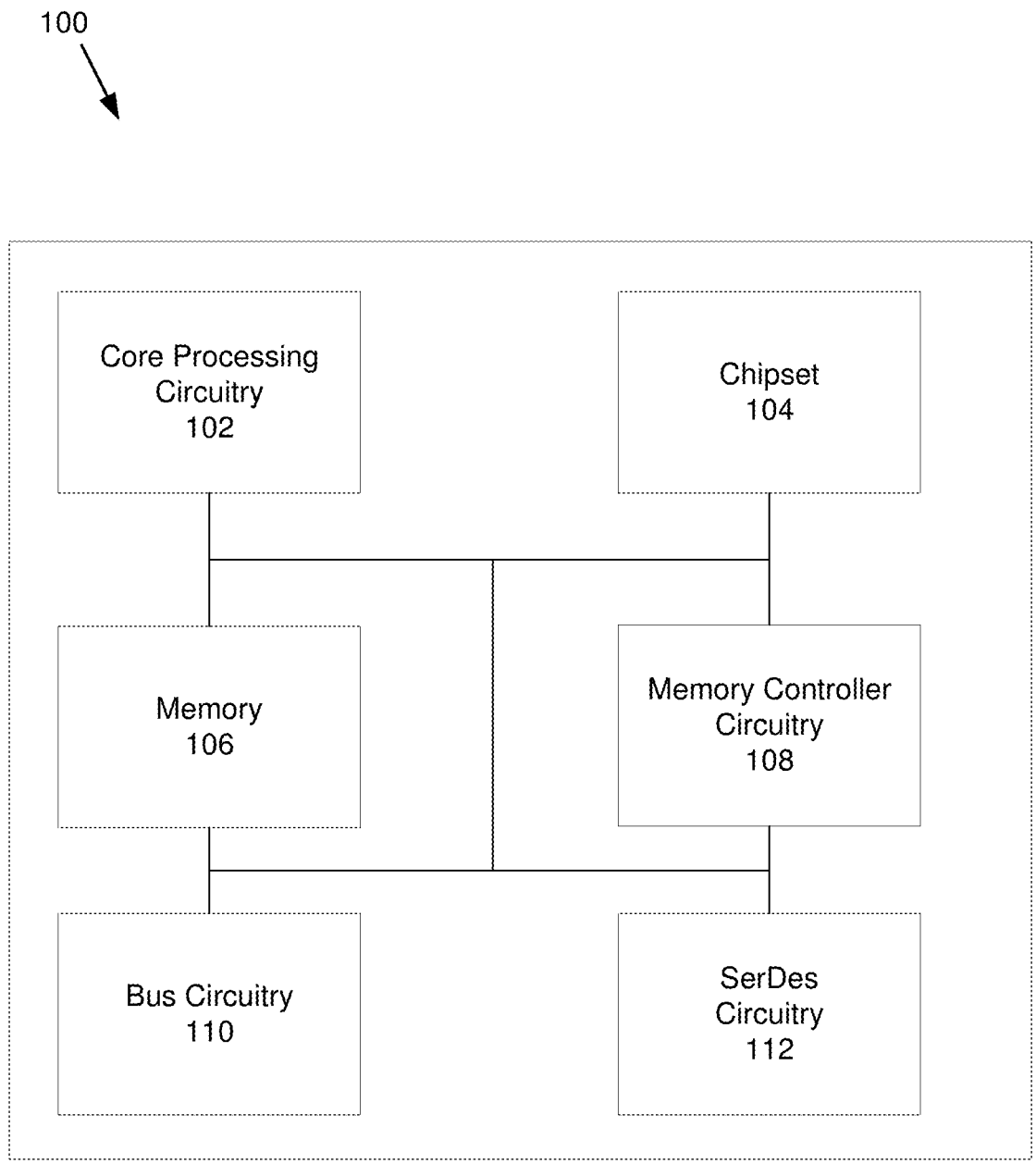
FIG. 1 is a diagram depicting an integrated circuit that may implement an embodiment of a CTLE process in accordance with the present disclosure.

Referring now to FIG. 1, an embodiment of an integrated circuit (IC) 100 in accordance with the present disclosure is shown. The term "integrated circuit", as used in any embodiment herein, may refer to a semiconductor device and/or microelectronic device, such as, for example, but not limited to, a semiconductor integrated circuit chip. The specific configuration, arrangement, and components shown in IC 100 are provided merely for exemplary purposes as additional and/or alternative configurations are also within the scope of the present disclosure.

In some embodiments, IC 100 may include core processing circuitry 102, which may include a variety of different processors such as those known in the art. Any suitable processor may be used without departing from the scope of the present disclosure. IC 100 may also include chipset 104. In some embodiments, chipset 104 may include both Northbridge/memory controller hub (MCH) and Southbridge/I/O controller hub (ICH) circuitry. These components may be included within chipset 104 or at any other location within IC 100. IC 100 may also include memory 106, which may be in communication with core processing circuitry 102. Memory 106 may comprise one or more of the following types of memories: semiconductor firmware memory, programmable memory, non-volatile memory, read-only memory, electrically programmable memory, random access memory, flash memory (which may include, for example, NAND or NOR type memory structures), magnetic disk memory, and/or optical disk memory. Either additionally or alternatively, memory may comprise other and/or later-developed types of computer-readable memory. In some embodiments, memory 106 may include, for example, 256 KB of two-way level 2 cache. IC 100 may additionally include memory controller circuitry 108 configured to manage the flow of data to and from memory. For example, in some embodiments, memory controller circuitry 108 may include a double-data-rate two synchronous dynamic random access memory (DDR2 SDRAM) controller. IC 100 may further include bus circuitry 110 configured to provide compatibility with a variety of different bus architectures, including, but not limited to, Universal Serial Bus (USB), Serial Advanced Technology Attachment (SATA), Peripheral Component Interface (PCI), PCI-Express and System Management Bus (SMBus).

IC 100 may also include SerDes circuitry 112, which may include numerous components configured to reconfigure a CTLE in a SerDes system. Some particular examples of the structure and operations of SerDes circuitry 112 are discussed in further detail hereinbelow.

As will be discussed in greater detail below, embodiments of the present disclosure may address various challenges in conventional signal transmission and SerDes circuitry. A CTLE for a SERDES receiver may need to provide a wide tuning range of high frequency gain (peaking) for equalizing a variety of channel lengths. For example, high peaking to equalize high-loss (long) channels, low peaking for low-loss (short) channels, etc. Traditional CTLE circuit designs in advanced CMOS nodes are plagued by parasitic capacitances which produce unwanted over-equalization for low-loss channels. Conventional circuit fixes for these unwanted over-equalization often mean significant increase in silicon area.

Accordingly, embodiments included herein describe a novel CTLE configuration that reduces unwanted over-equalization. In some embodiments, a compact version of the above novel CTLE configuration may significantly reduce the impact on silicon area. Embodiments may also include a flexible CTLE reconfiguring scheme to provide a wide tuning range with well-controlled tuning steps as well including various applications of the CTLE reconfiguring scheme. As will be discussed in greater detail below, embodiments of the present disclosure may address these challenges.

Figure 2:
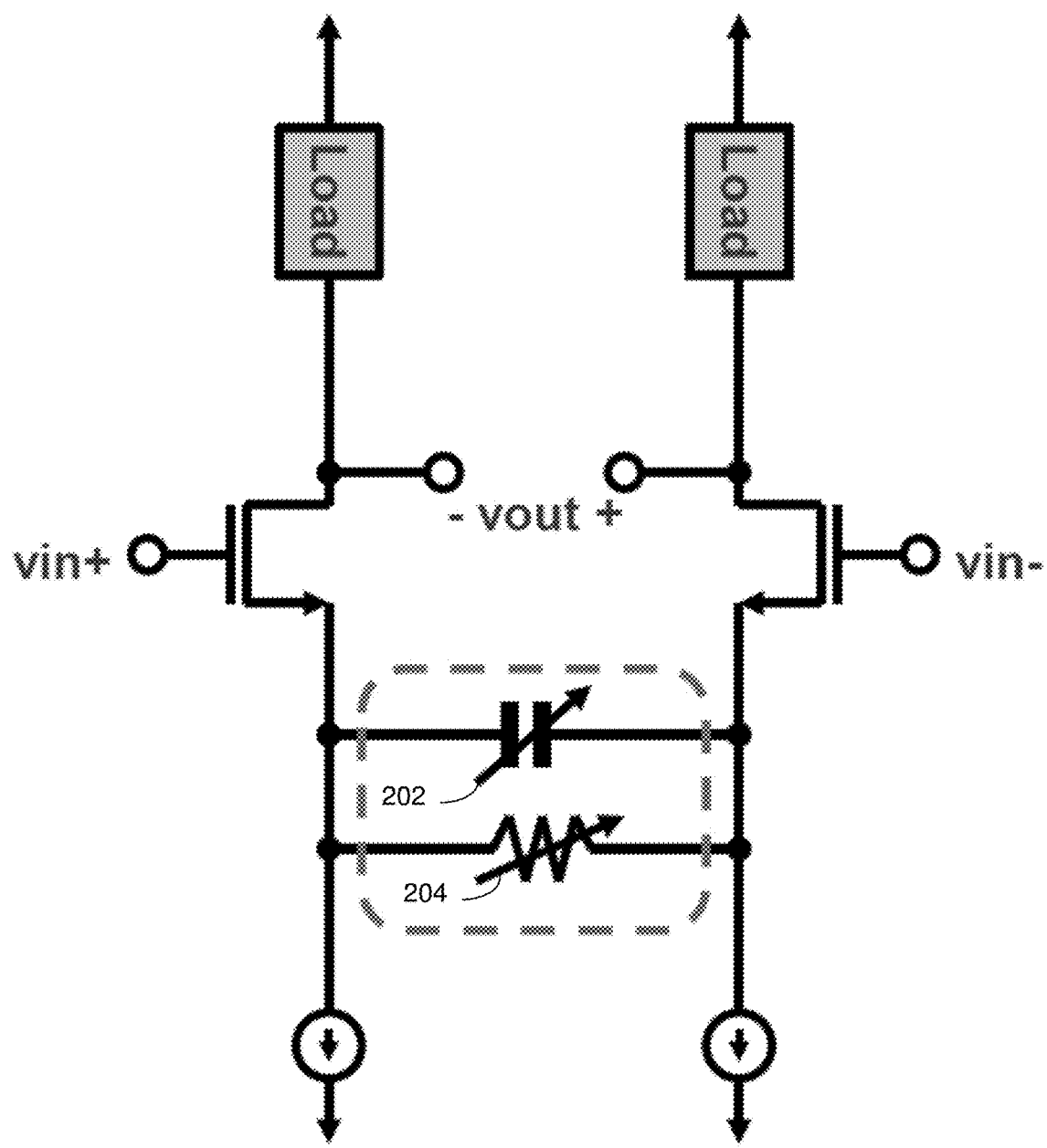
FIG. 2 is a diagram depicting an embodiment of traditional CTLE circuitry.

Referring now to FIG. 2, a diagram depicting an example of traditional CTLE design is provided. In a classic CTLE, the frequency response may be tuned by the components identified in FIG. 2. The amount of high-frequency peaking may be tuned by variable degeneration capacitor 202. Additionally and/or alternatively, the low-frequency (DC) gain may be tuned by the variable degeneration resistor 204.

Figure 3:
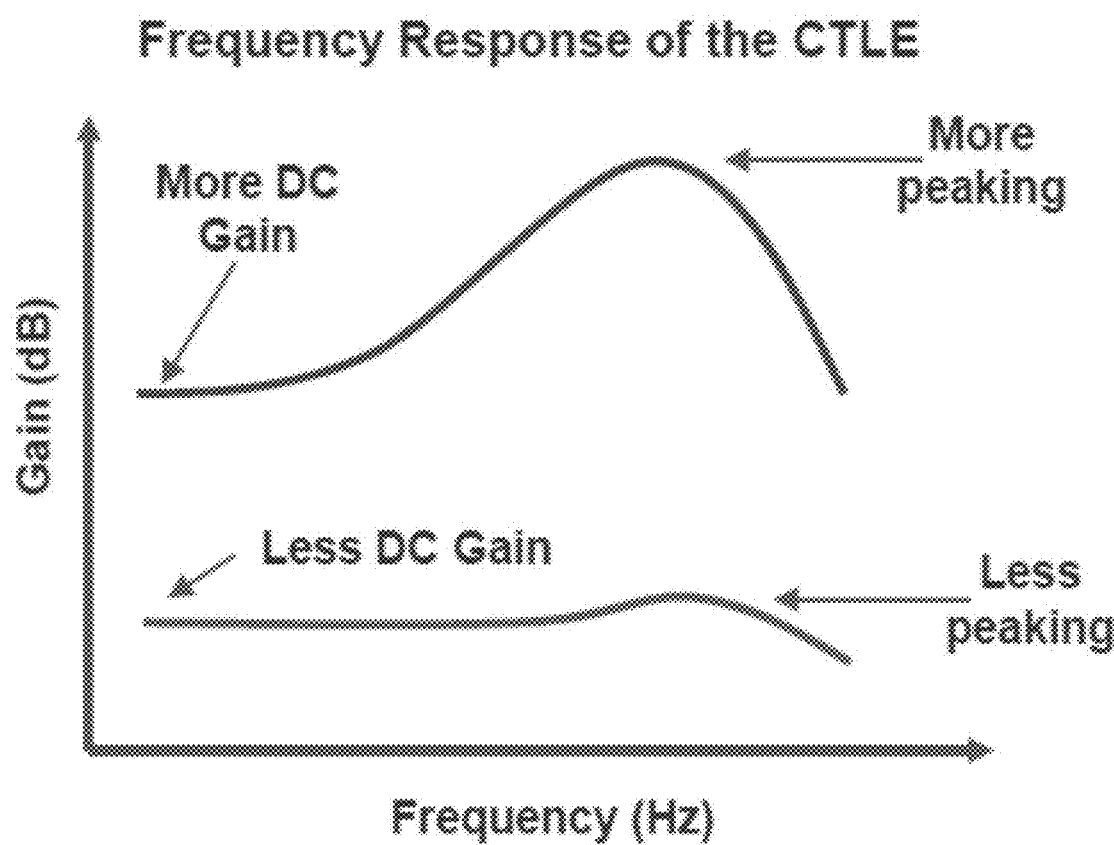
FIG. 3 is a plot showing an example of the frequency response of the CTLE.

Referring also to FIG. 3, a plot 300 depicting an example frequency response of the CTLE is provided. In order to equalize channels of different lengths, the desired CTLE tuning typically includes multiple characteristics. For (long) high-loss channels, it may be beneficial to have more peaking (e.g., higher degeneration capacitance) and/or more DC gain (e.g., lower degeneration resistance). Additionally and/or alternatively, for (short) low-loss channels, it may be beneficial to have less peaking (e.g., less degeneration capacitance) and/or less DC gain (e.g., higher degeneration resistance).

Figure 4:
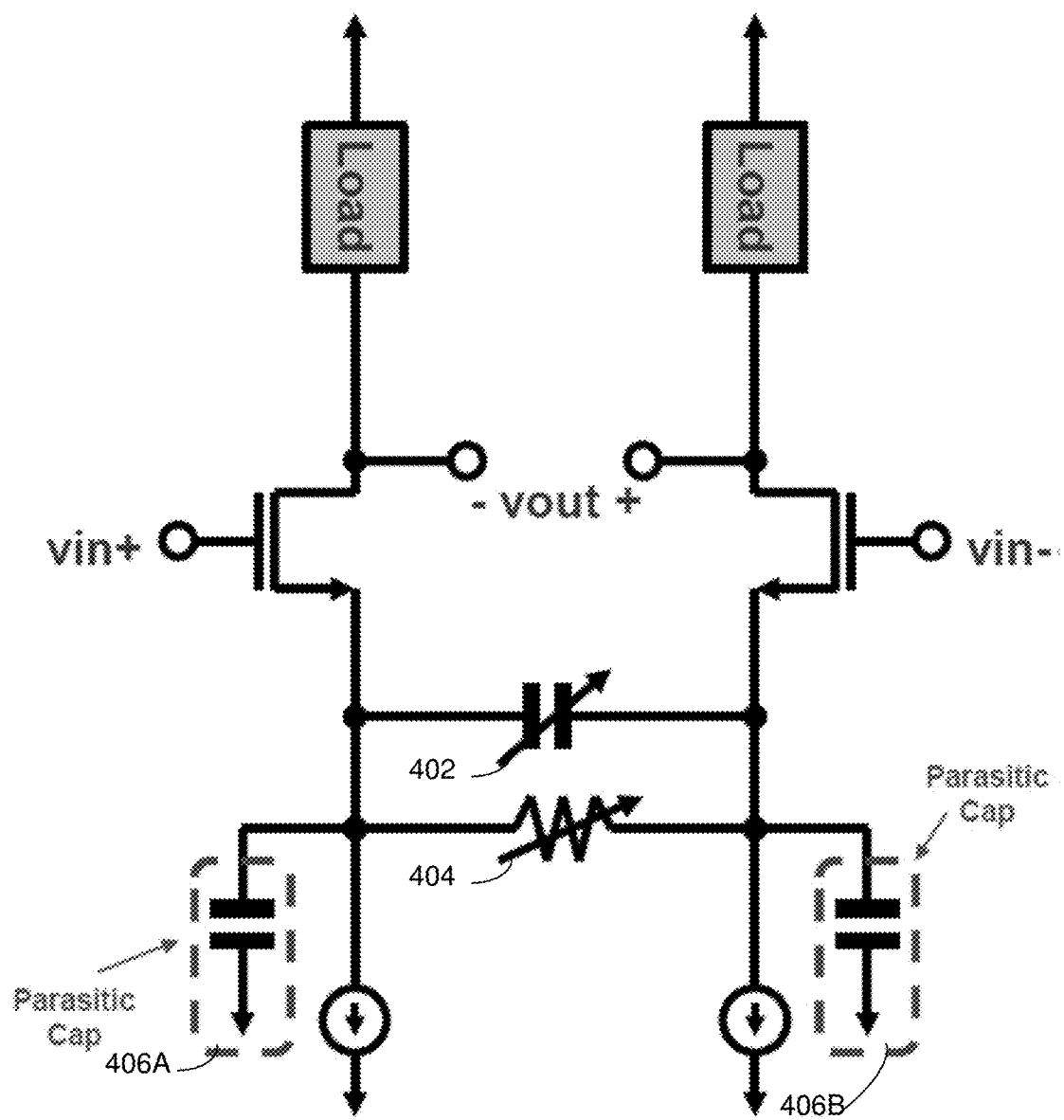
FIGS. 4-5 show a diagram depicting an embodiment of traditional CTLE circuitry and an associated plot.
Figure 5:
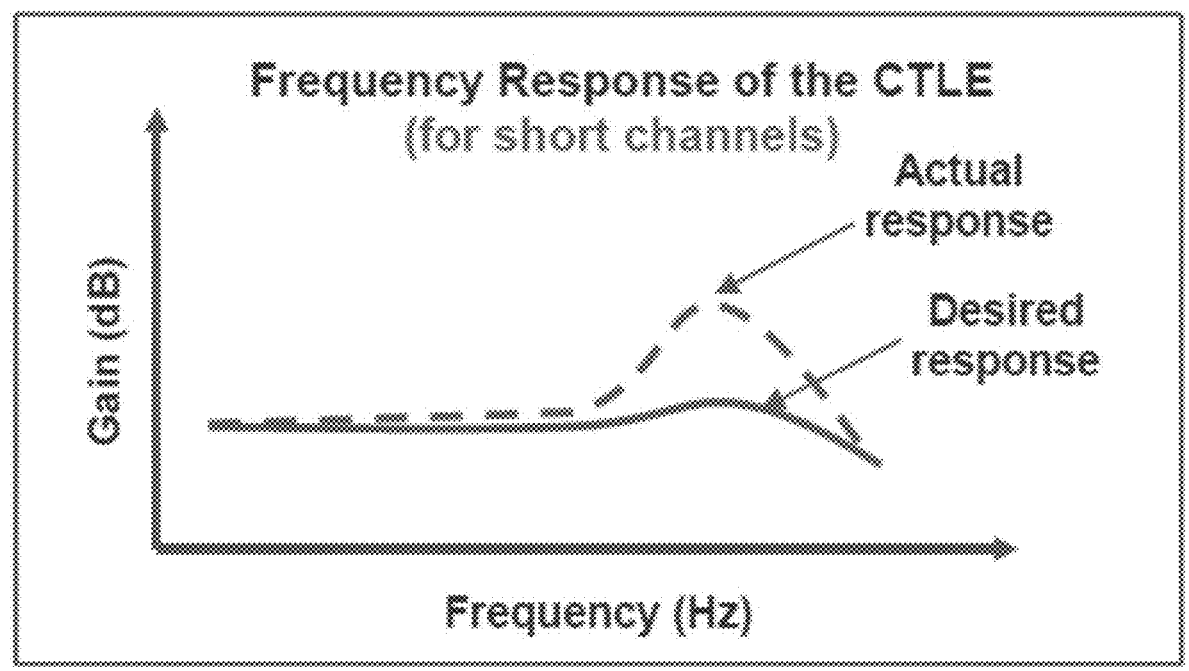

Referring now to FIG. 4, a diagram 400 depicting an example showing a traditional CTLE circuit is provided. This example shows one of the drawbacks of a traditional CTLE, namely, the issue of parasitic capacitance. For the low-loss channels, minimal peaking is desired. Generally, variable degeneration capacitor 402 would be set to the minimum to reduce peaking. Degeneration resistor 404 may be set to reduce DC gain. However, the presence of parasitic capacitance 406A, 406B (circled in FIG. 4) interacts with the high degeneration resistor 404 and generates undesired peaking. This undesired peaking behavior causes over-equalization for short channels, which is a drawback of the classical CTLE circuit. FIG. 5 shows a plot of the frequency response of the CTLE.

Figure 6:
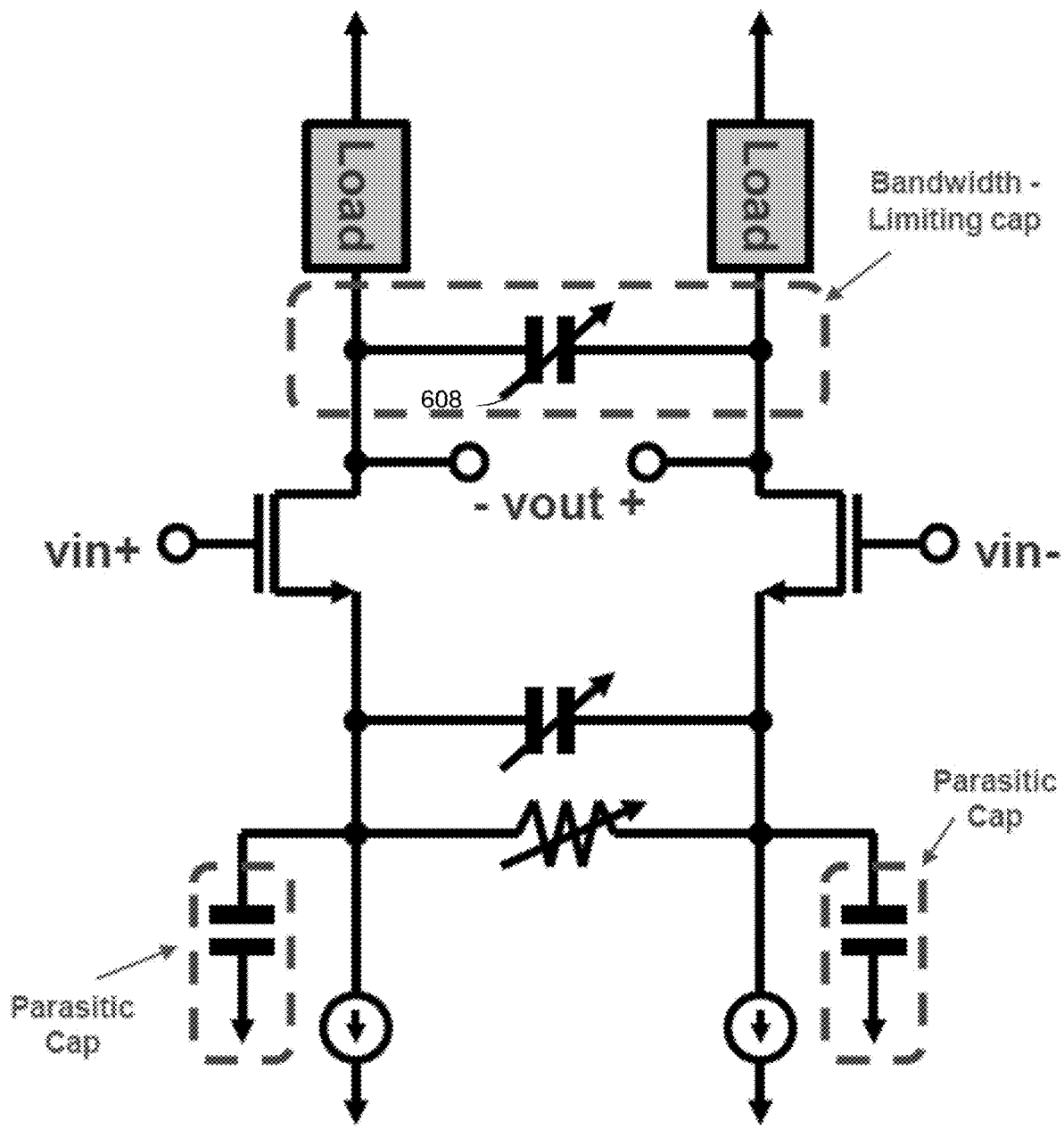
FIG. 6 is a diagram depicting an embodiment of traditional CTLE circuitry.

Referring also to FIG. 6 a diagram 600 depicting a traditional approach is provided. Traditionally, the parasitic peaking in low gain was either ignored, which resulted in over-equalizing the short channels or, alternatively, additional capacitors 608 were included at the output to limit the bandwidth. However, adding capacitors (especially metal-oxide-metal "MOM" capacitors) consumes a significant amount of silicon real-estate.

Figure 7:
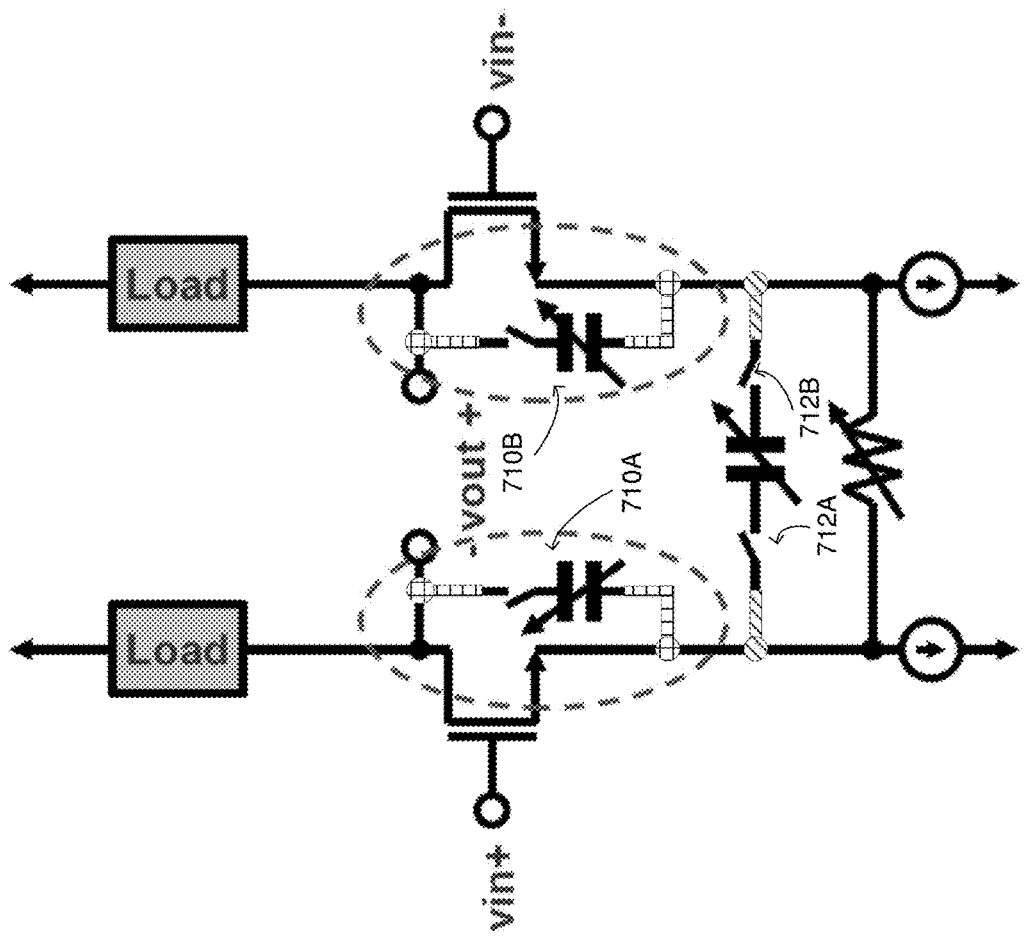
FIG. 7 is a diagram depicting CTLE circuitry consistent with an embodiment of the present disclosure.

Referring also to FIG. 7 a diagram 700 depicting a circuit consistent with embodiments of the present disclosure is provided. Diagram 700 includes a circuit configuration to reduce high frequency peaking and bandwidth in the CTLE. In some embodiments, the circuit may include one or more switches and extra capacitor arrays 710A, 710B to create a capacitive path between the drain and source of each differential pair MOS, which reduces the peaking. The source-degenerated capacitor array may also be connected by switches 712A, 712B. In some embodiments, switches 712A, 712B may be turned on when peak generation is required.

Figure 8:
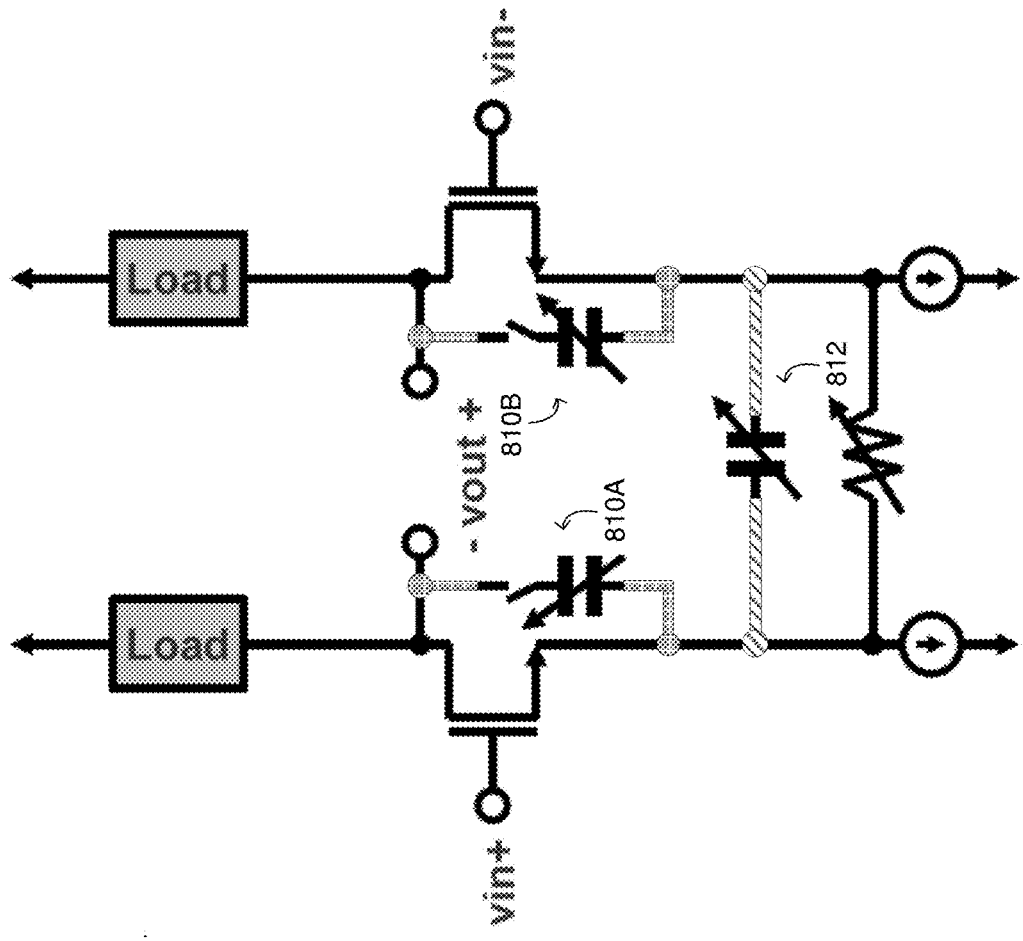
FIG. 8 is a diagram depicting CTLE circuitry consistent with an embodiment of the present disclosure.

Referring also to FIG. 8 a diagram 800 depicting a circuit consistent with embodiments of the present disclosure is provided. Diagram 800 includes a circuit configuration that is in peak generation mode. In this example, the source-degenerated capacitor array 812 may be connected in a similar arrangement to switches 712A/712B shown in FIG. 7. In contrast, the capacitor arrays for peak reduction 810A, 810B may be disconnected.

Figure 9:
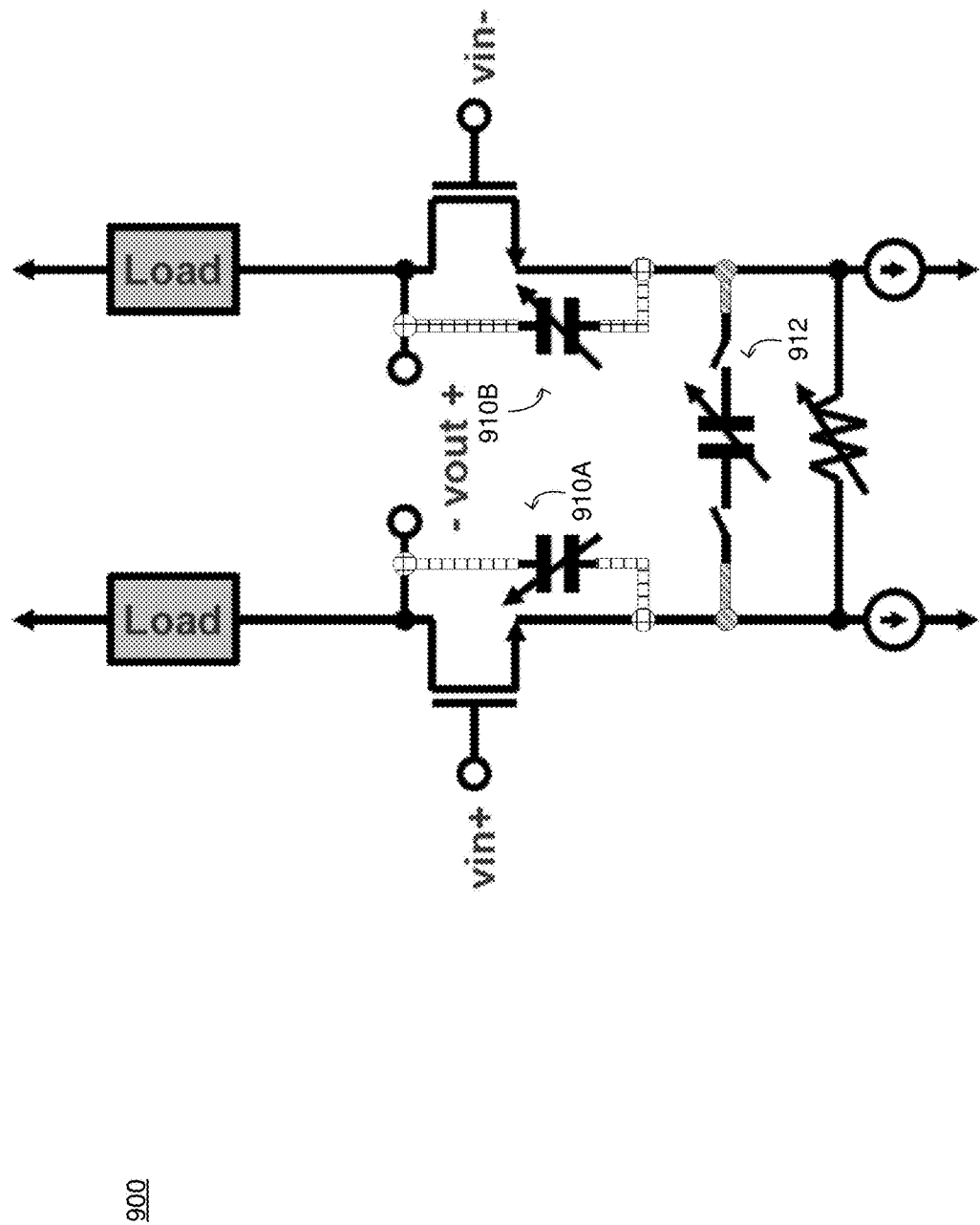
FIG. 9 is a diagram depicting CTLE circuitry consistent with an embodiment of the present disclosure.

Referring also to FIG. 9 a diagram 900 depicting a circuit consistent with embodiments of the present disclosure is provided. Diagram 900 includes a circuit configuration that is in peak reduction mode. In this example, when the circuit is in peak reduction mode, the capacitor arrays for peak reduction 910A, 910B may be connected similar arrangement to switches 710A/710B shown in FIG. 7. This unconventional connection may reduce the bandwidth of the amplifier, thus reducing peaking. The source-degenerated capacitor array 912 may be disconnected.

Figure 10:
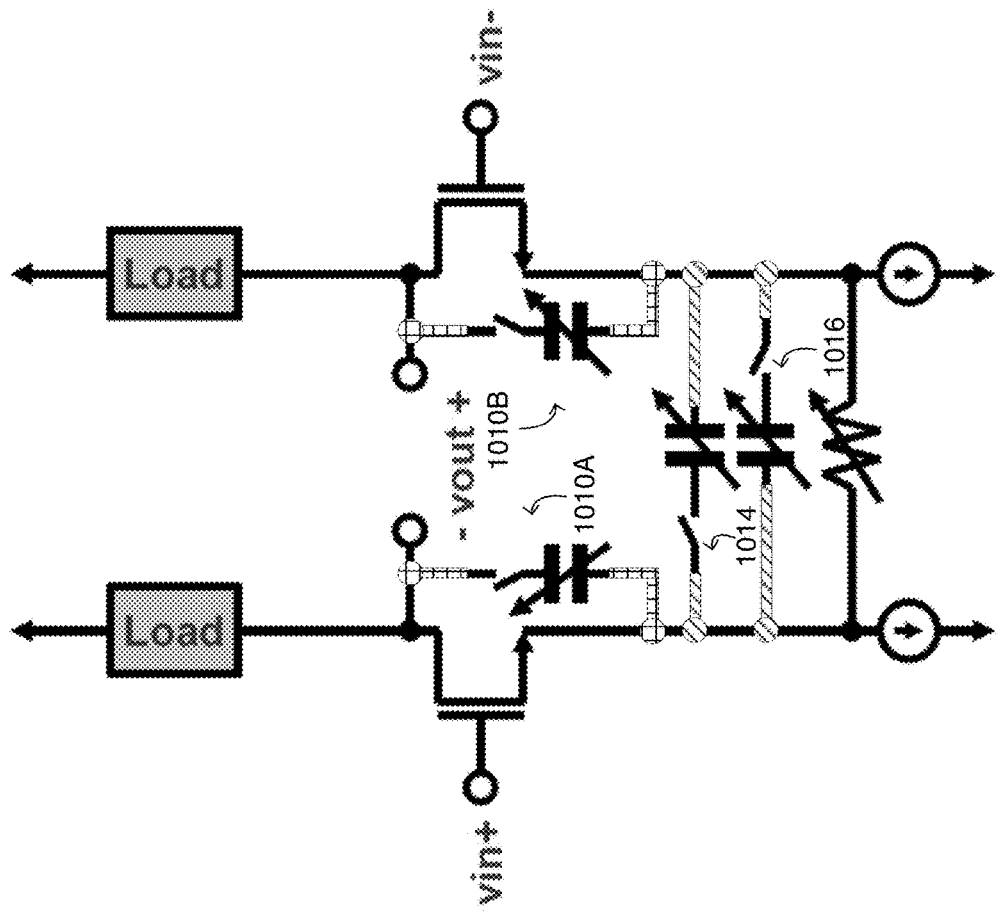
FIG. 10 is a diagram depicting CTLE circuitry consistent with an embodiment of the present disclosure.

Referring also to FIG. 10 a diagram 1000 depicting a circuit consistent with embodiments of the present disclosure is provided. Diagram 1000 includes an alternative circuit configuration. In this configuration the source-degeneration capacitor array may be implemented as shown in FIG. 10 to reduce parasitic capacitances at the source nodes due to the presence of one or more switches. In order to produce the equivalent peak generation performance as a traditional CTLE, each one of the two capacitors arrays 1014, 1016 here may be selected to half of the size of the degeneration capacitor array in the traditional CTLE. In some embodiments, either single-valued capacitors may be implemented and/or arrays of capacitors (as shown above) associated with an array of switches for tunability.

Figure 11:
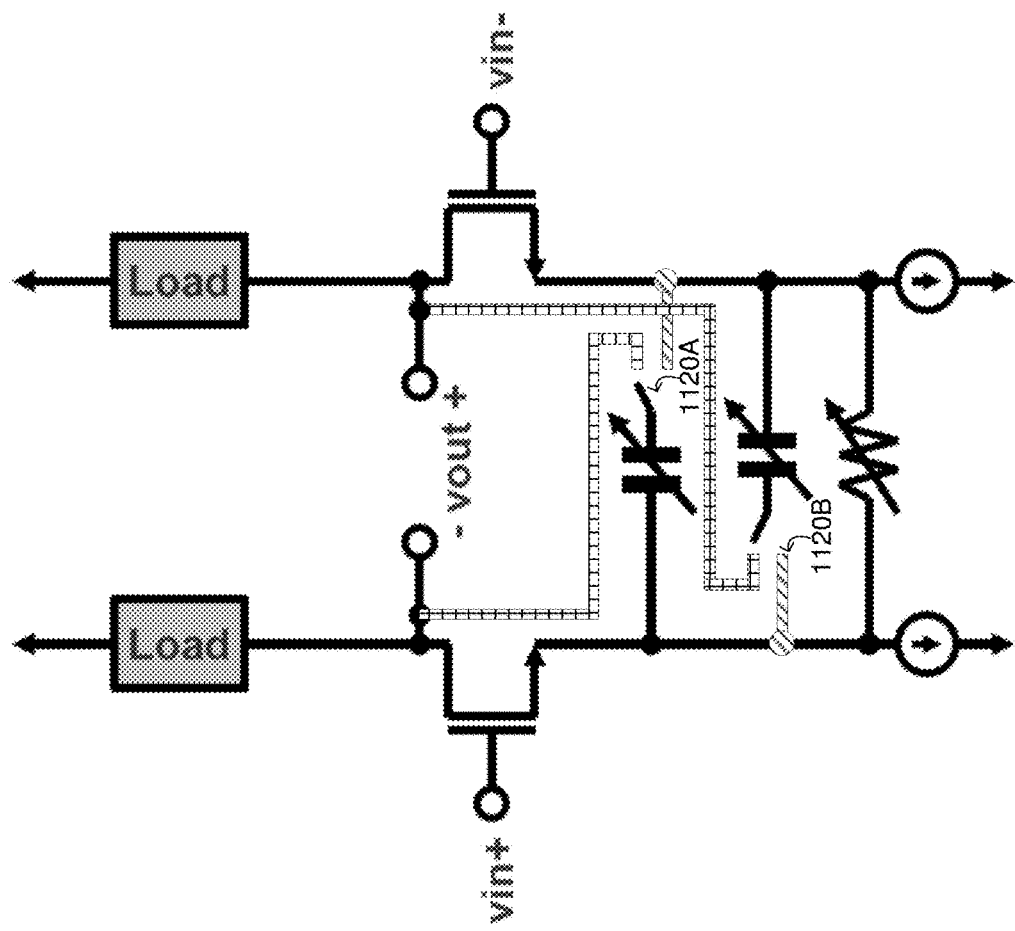
FIG. 11 is a diagram depicting CTLE circuitry consistent with an embodiment of the present disclosure.

Referring also to FIG. 11 a diagram 1100 depicting a circuit consistent with embodiments of the present disclosure is provided. Diagram 1100 includes a circuit that includes one or more switches 1120A, 1120B to create a capacitive path between the drain and source of each differential pair MOS, which may help to reduce the peaking. In some embodiments, the switches may be configured in a source-degenerative fashion for peak generation. This approach recognizes that the peak-reduction functionality is not used simultaneously with peaking generation, and, as such, the same capacitor array may perform both functions. For the same peak-generation performance, it may require the same total capacitance as the classical CTLE. However, in addition to generating peaking, it provides the additional functionality of peak-reduction. The result is that a much wider peak-tuning range may be achieved with the same number of caps. Thus, the additional functionality comes with little impact to the silicon size required.

Figure 12:
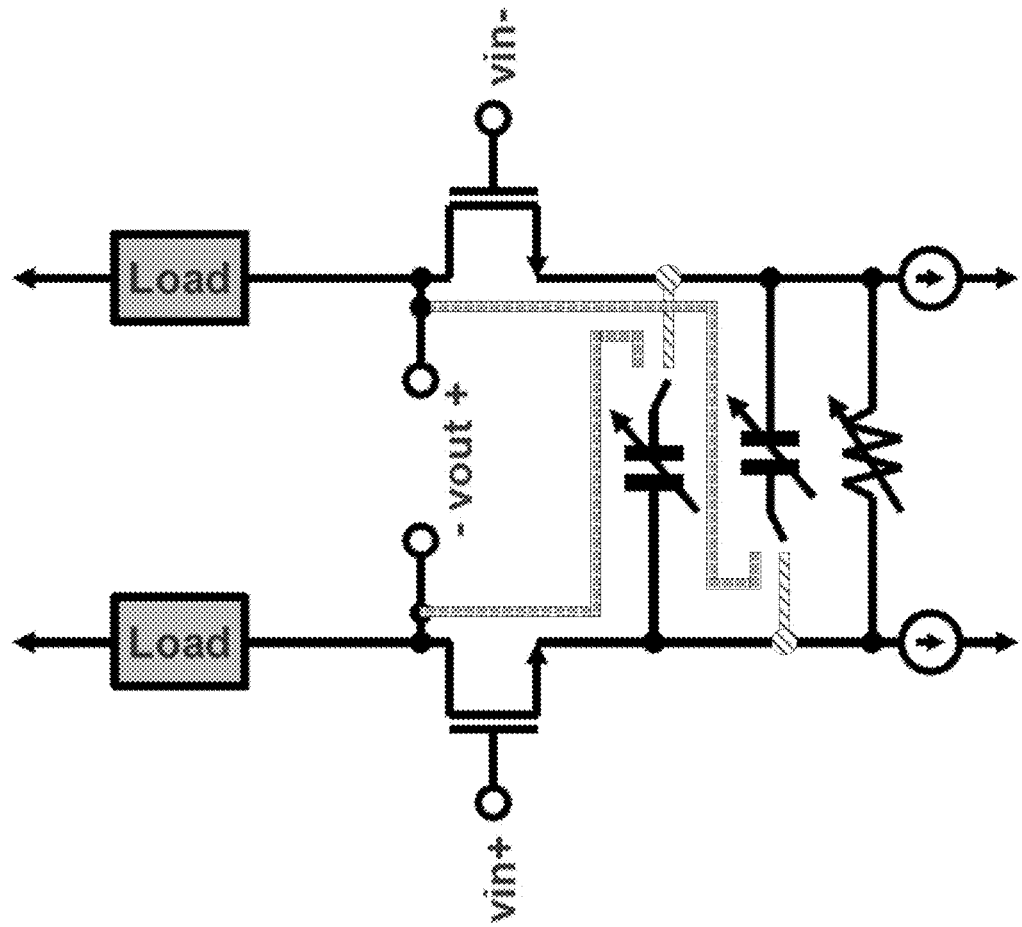
FIG. 12 is a diagram depicting CTLE circuitry consistent with an embodiment of the present disclosure.

Referring also to FIG. 12 a diagram 1200 depicting a circuit consistent with embodiments of the present disclosure is provided. Diagram 1200 includes a circuit showing its operation in a peak generation mode. The switches may be configured in a source-degenerative fashion, which is equivalent to the traditional CTLE approach. In order to produce the equivalent peak generation performance as the classic CTLE, each one of the two capacitors may be selected as roughly half the size of the degeneration capacitor in the traditional CTLE.

Figure 13:
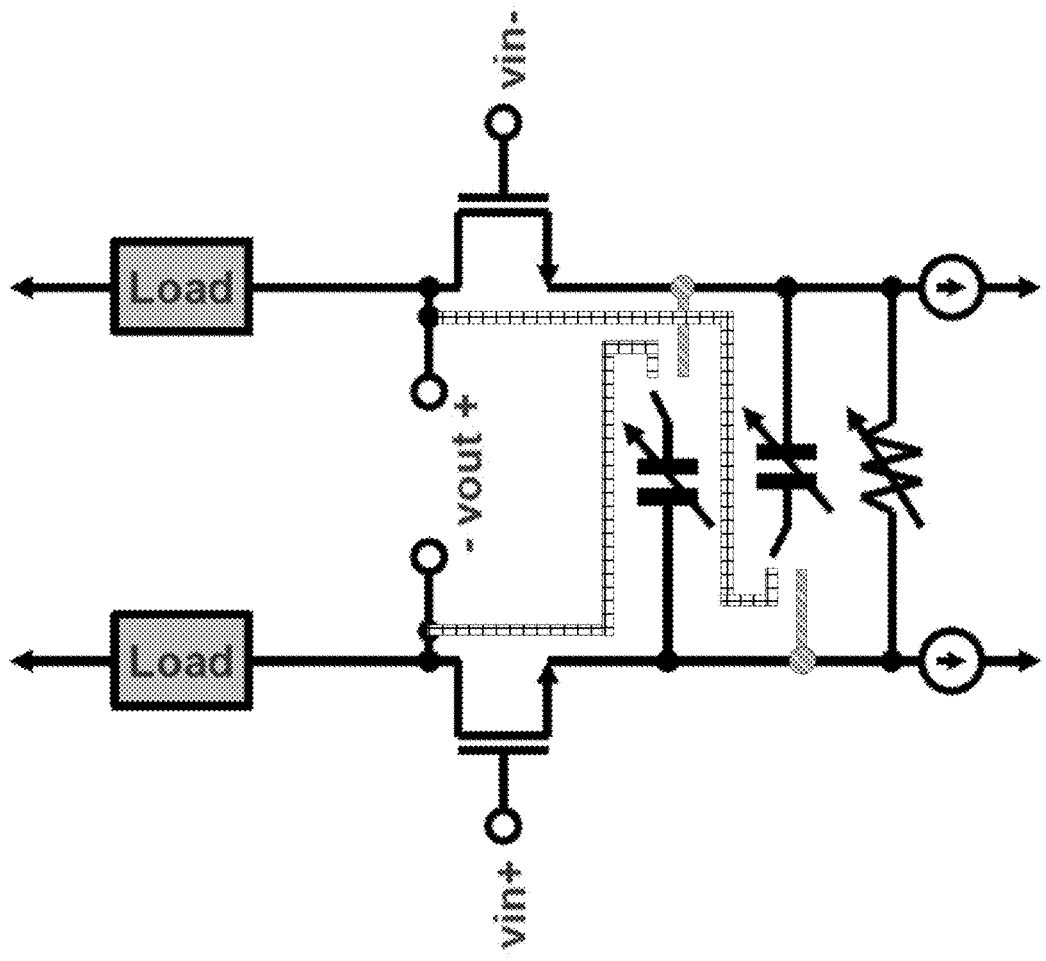
FIG. 13 is a diagram depicting CTLE circuitry consistent with an embodiment of the present disclosure.

Referring also to FIG. 13 a diagram 1300 depicting a circuit consistent with embodiments of the present disclosure is provided. Diagram 1300 includes a circuit showing its operation in a peak reduction mode. The switches may be configured to provide a capacitive path between the source and drain of each MOS in the differential pair. This unconventional connection may reduce its bandwidth, and consequently, the peaking amount. This approach may be implemented either by using single-valued capacitors or arrays of capacitors having arrays of switches associated therewith for tunability (as shown in the previous slides).

In some embodiments, embodiments included herein may include an approach to control a CTLE that has a dual-functionality of peak generation and peak reduction ("reconfigurable CTLE") as provided above. The capacitors in a reconfigurable CTLE may be implemented as arrays of capacitors instead of single-valued capacitors. This provides tuning capability. To simplify the configuration control of all the capacitors in a capacitor array, embodiments included herein may recognize that the use cases where the CTLE is configured to enhance or reduce peaking are mutually-exclusive. Therefore, all the constituent caps in a capacitor array should either be configured for peak generation or peak reduction in unison. For high-loss channels, all capacitors may be configured to peak-generation mode, while for low-loss channels, all capacitors may be configured to peak-reduction mode.

In some embodiments, a flexible peaking control sequence may be utilized such a smooth transition from maximum peak reduction to maximum peak generation is achieved, and vice versa. One example of such a sequence for a capacitor array of N elements is provided below. Peaking may increase gradually and monotonically as we traverse down each of the operations below. The process may include enabling N capacitors in the capacitor array, using all switches in the peak-reduction position (e.g., maximum peak reduction). The process may then enable N−1 capacitors in the capacitor array, with N−1 switches in the peak-reduction position, etc. Then, the process may enable one capacitor in the capacitor array, with one switch in the peak-reduction position. The process may then enable zero capacitors in the capacitor array, with all switches are off. The process may enable one capacitor in the capacitor array, with one switch in the peak-generation position, etc. The process may then enable N−1 caps in the capacitor array, with N−1 switches in the peak-generation position. The process may then enable N capacitors in the capacitor array, with all switches in the peak-generation position (e.g., maximum peak generation). This approach may be used in accordance with any of the circuits included herein.

Figure 14:
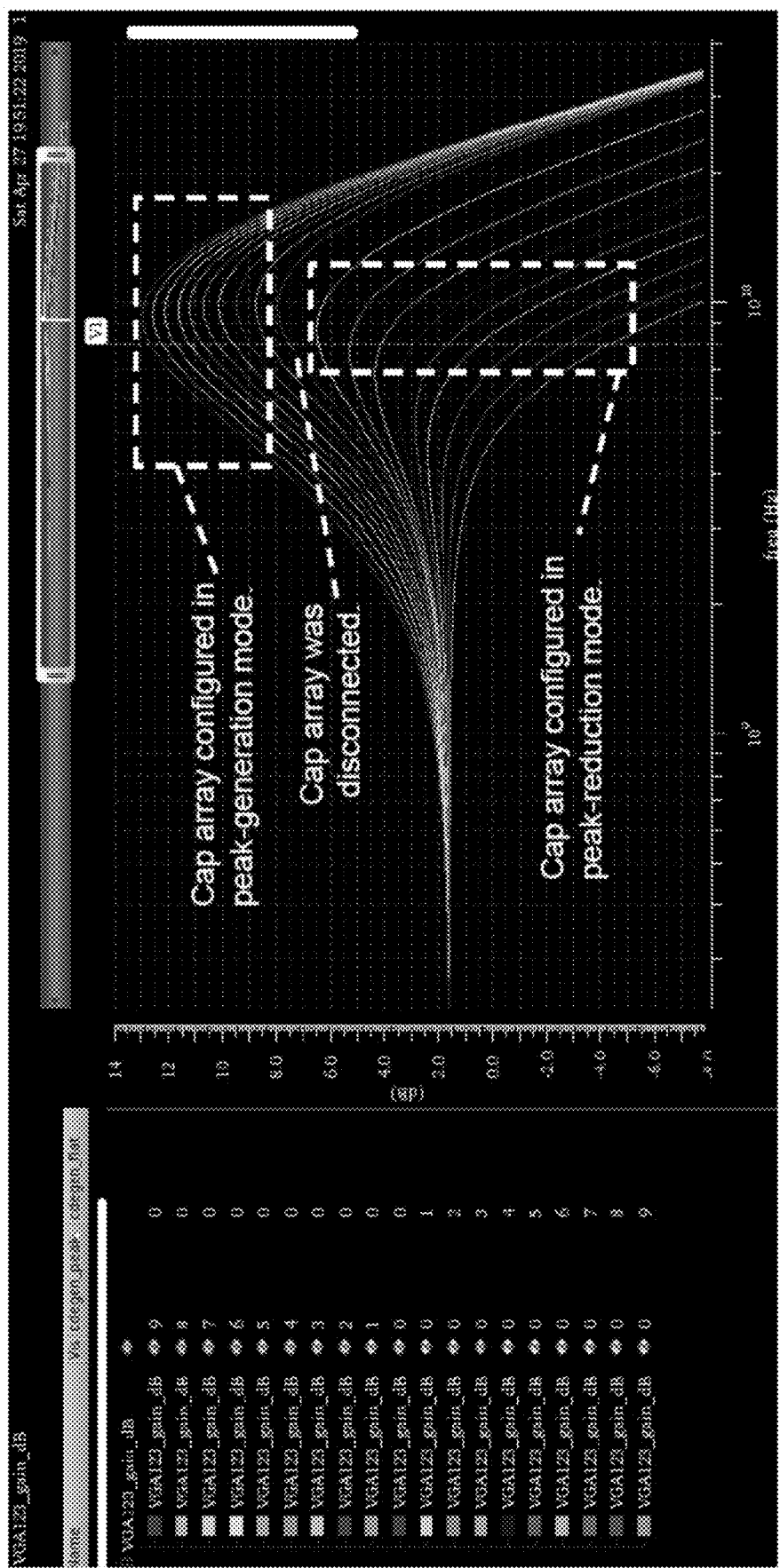
FIG. 14 is a display depicting an embodiment of a plurality of correction locations in accordance with the present disclosure.

An example display 1400 is shown in FIG. 14. Display 1400 shows an example frequency response of a configurable CTLE. In this example, for a capacitor array of 9 elements (N=9) a smooth transition from highest peaking to highest peak reduction is shown.

Figure 15:
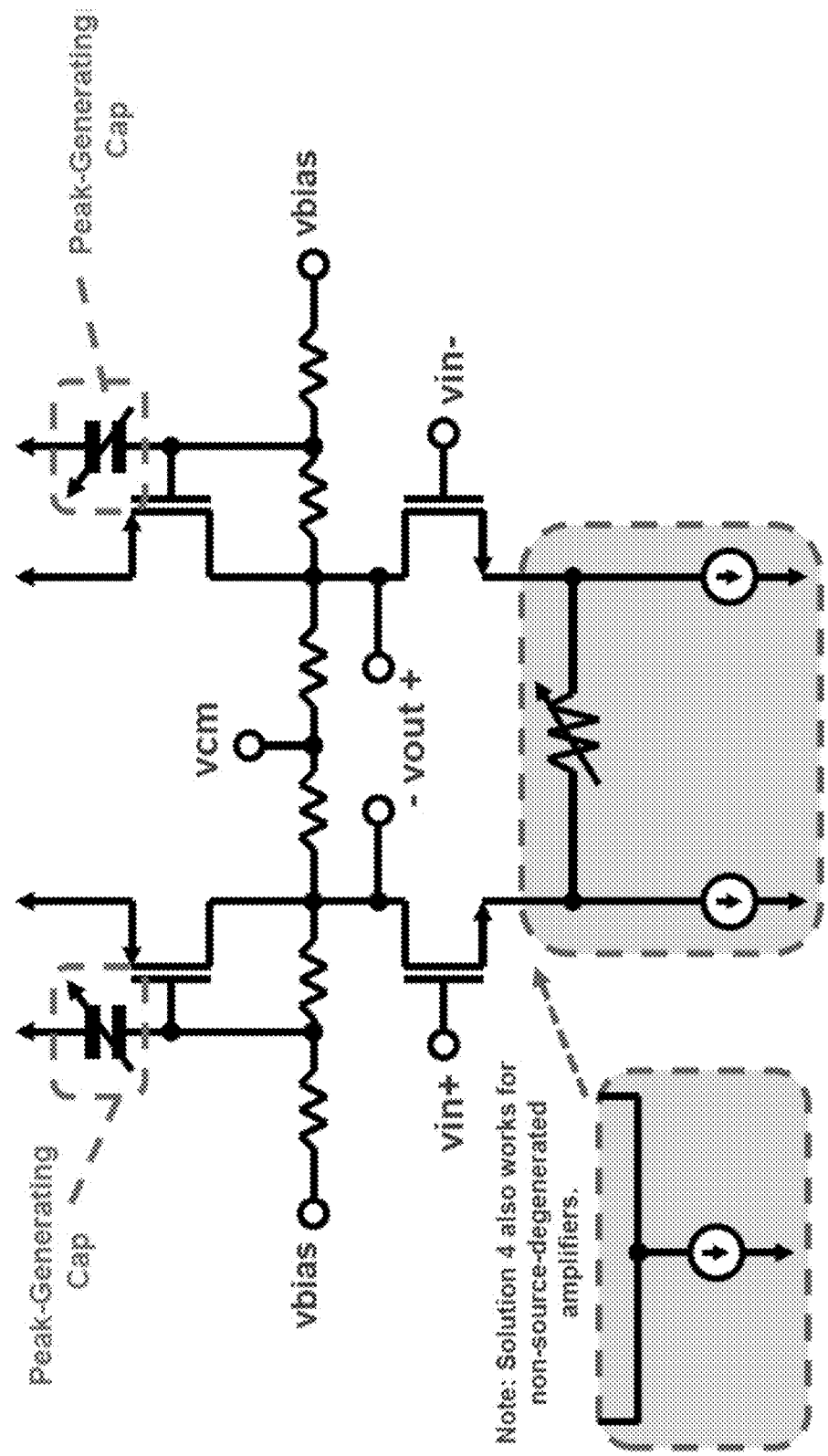
FIG. 15 is a diagram depicting CTLE circuitry consistent with an embodiment of the present disclosure.
Figure 16:
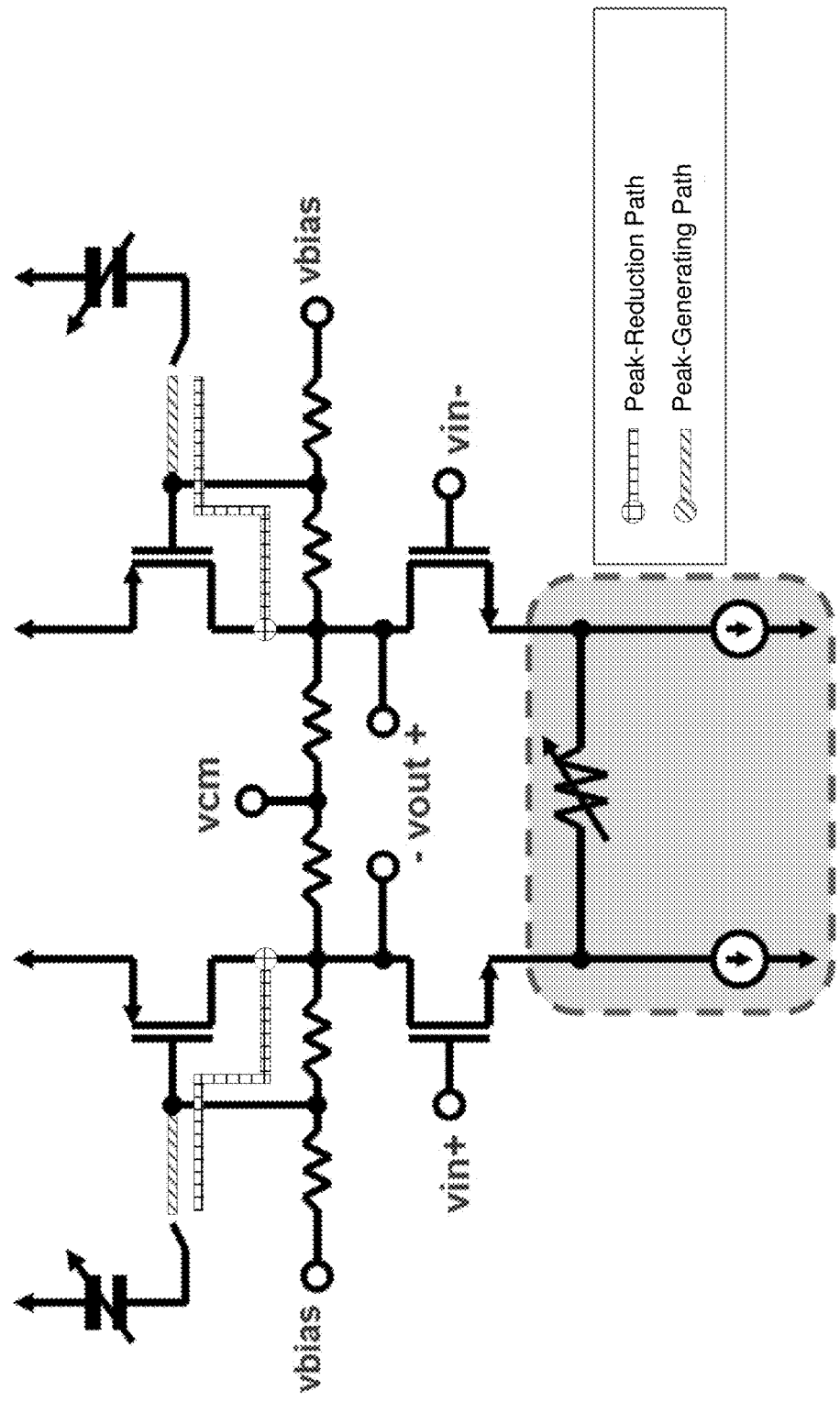
FIG. 16 is a diagram depicting CTLE circuitry consistent with an embodiment of the present disclosure.
Figure 17:
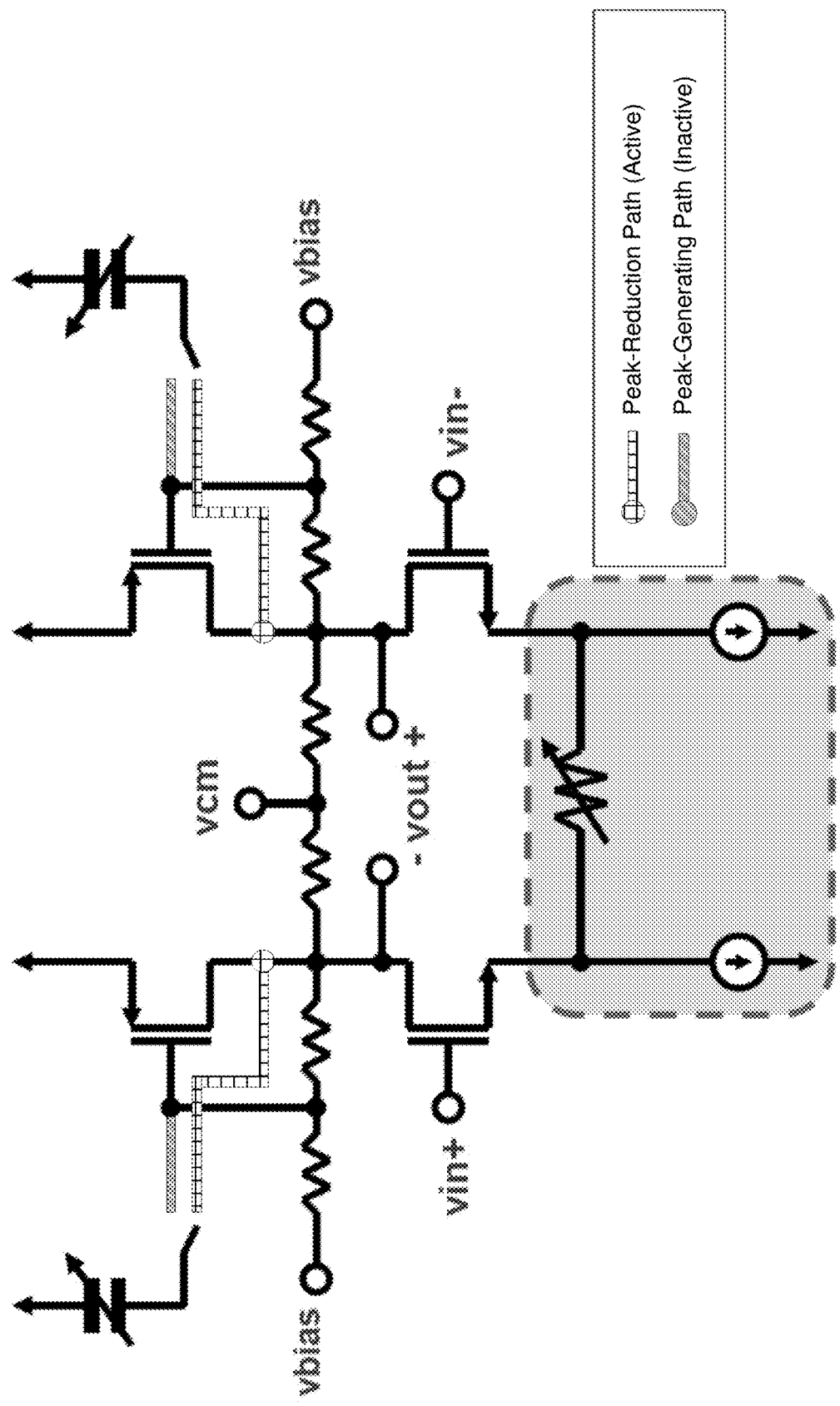
FIG. 17 is a diagram depicting CTLE circuitry consistent with an embodiment of the present disclosure.
Figure 18:
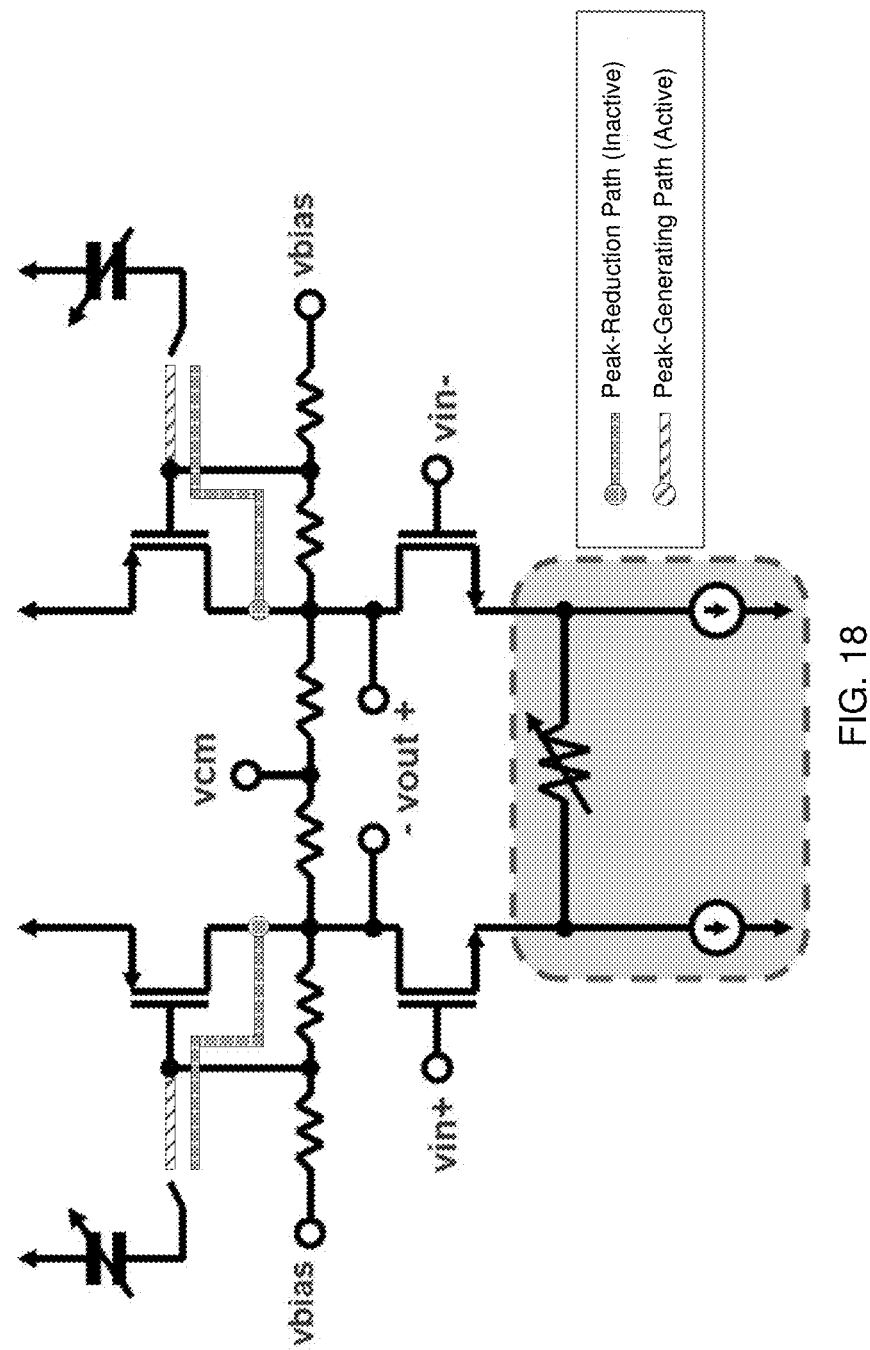
FIG. 18 is a diagram depicting CTLE circuitry consistent with an embodiment of the present disclosure.

Referring also to FIGS. 15-18, embodiments showing diagrams depicting circuits consistent with embodiments of the present disclosure is provided. Referring now to FIG. 15, the flexible peaking control sequence described above may be extended to a CTLE using an active inductor load structure. In some embodiments, and referring also to FIG. 16, the capacitor array in the active inductor circuit may be converted to a dual-purpose peak-generation/reduction configuration. FIG. 17 shows a diagram 1700 that illustrates an example of the reconfigurable active inductor CTLE design a peak generation mode. In contrast, FIG. 18 shows a diagram 1800 that illustrates the reconfigurable active inductor CTLE design in a peak reduction mode.

Referring now to FIG. 19, a flowchart 1900 including operations consistent with embodiments of the present disclosure is provided. The method may include providing 1902 a differential amplifier including a first transistor and a second transistor, wherein the differential amplifier includes a peak-generating path and a peak-reduction path. The method may further include reducing 1904 bandwidth using a first switch and a first capacitor located between a source and a drain of the first transistor and a second switch and a second capacitor located between a source and a drain of the second transistor to create a capacitive path between the source and drain. Numerous additional operations are also within the scope of the present disclosure.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A continuous time linear equalization circuit, comprising:
   a differential amplifier including a first transistor and a second transistor, wherein the differential amplifier includes a peak-generating path and a peak-reduction path; and
   at least one switch and at least one capacitor located between a source and a drain of at least one of the first transistor and the second transistor to create a capacitive path between the source and drain, wherein the at least one switch and at least one capacitor are configured to reduce bandwidth, wherein the at least one switch and the at least one capacitor includes a first switch and a first capacitor located between a source and a drain of the first transistor and a second switch and a second capacitor located between a source and a drain of the second transistor; and
   a source degenerated capacitor array that is connected in a peak generation mode and disconnected in a peak reduction mode.

2. The continuous time linear equalization circuit of claim 1, wherein the at least one switch is disconnected in a peak generation mode and connected in a peak reduction mode.

3. The continuous time linear equalization circuit of claim 1, wherein the source degenerated capacitor array includes one capacitor.

4. The continuous time linear equalization circuit of claim 1, wherein the source degenerated capacitor array includes a plurality of capacitors.

5. The continuous time linear equalization circuit of claim 1, wherein the first switch and the second switch are connected in a source degenerative configuration wherein the source degenerative configuration is connected in a peak generation mode and disconnected in a peak reduction mode, wherein the source degenerated capacitor array includes a plurality of capacitors.

6. A method for continuous time linear equalization, comprising:
   providing a differential amplifier including a first transistor and a second transistor, wherein the differential amplifier includes a peak-generating path and a peak-reduction path;
   reducing high frequency peaking using a first switch and a first capacitor located between a source and a drain of the first transistor and a second switch and a second capacitor located between a source and a drain of the second transistor to create a capacitive path between the source and drain; and
   connecting a source degenerated capacitor array in a peak generation mode or disconnecting the source degenerated capacitor array in a peak reduction mode.

7. The method for continuous time linear equalization circuit of claim 6, wherein at least one of the first switch and the second switch is disconnected in a peak generation mode and connected in a peak reduction mode.

8. The method for continuous time linear equalization circuit of claim 6, wherein the source degenerated capacitor array includes one capacitor.

9. The method for continuous time linear equalization circuit of claim 6, wherein the source degenerated capacitor array includes a plurality of capacitors.

10. The method for continuous time linear equalization circuit of claim 7, wherein the first switch and the second switch are connected in a source degenerative configuration wherein the source degenerative configuration is connected in a peak generation mode and disconnected in a peak reduction mode, wherein the source degenerated capacitor array includes a plurality of capacitors.

11. A method for continuous time linear equalization, comprising:
   providing a differential amplifier including a first transistor and a second transistor, wherein the differential amplifier includes a peak-generating path and a peak-reduction path;
   reducing high frequency peaking using at least one switch and at least one capacitor located between a source and a drain of the first transistor;
   enabling N of the at least one capacitor and each of the at least one switch in a peak reduction position during maximum peak reduction, wherein N is a maximum number of capacitors; and
   enabling one of the at least one capacitor and each of the at least one switch in a peak generation position.

12. The method for continuous time linear equalization of claim 11, further comprising:
   enabling N-1 of the at least one capacitor and each of the at least one switch in a peak reduction position.

13. The method for continuous time linear equalization of claim 12, further comprising:
   enabling one of the at least one capacitor and each of the at least one switch in a peak reduction position.

14. The method for continuous time linear equalization of claim 13, further comprising:
   enabling zero of the at least one capacitor and none of the at least one switch.

15. The method for continuous time linear equalization of claim 11, further comprising:
   enabling N-1 of the at least one capacitor and each of the at least one switch in a peak generation position.

16. The method for continuous time linear equalization of claim 15, further comprising:
   enabling N of the at least one capacitor and each of the at least one switch in a peak generation position during maximum peak generation.

* * * * *